(12) United States Patent
Nakagome et al.

(10) Patent No.: US 12,255,216 B2
(45) Date of Patent: Mar. 18, 2025

(54) PHOTOELECTRIC CONVERSION DEVICE, IMAGING DEVICE, AND IMAGING SYSTEM

(71) Applicant: TOPPAN Inc., Tokyo (JP)

(72) Inventors: Tomohiro Nakagome, Taito-ku (JP); Yu Ookubo, Taito-ku (JP)

(73) Assignee: TOPPAN Inc., Tokyo (JP)

( * ) Notice: Subject to any disclaimer, the term of this patent is extended or adjusted under 35 U.S.C. 154(b) by 363 days.

(21) Appl. No.: 17/682,195

(22) Filed: Feb. 28, 2022

(65) Prior Publication Data

US 2022/0181375 A1 Jun. 9, 2022

Related U.S. Application Data

(63) Continuation of application No. PCT/JP2020/032572, filed on Aug. 28, 2020.

(30) Foreign Application Priority Data

Aug. 30, 2019 (JP) .................................. 2019-157644
Aug. 30, 2019 (JP) .................................. 2019-157645

(51) Int. Cl.
*H01L 27/146* (2006.01)

(52) U.S. Cl.
CPC .. *H01L 27/14629* (2013.01); *H01L 27/14627* (2013.01)

(58) Field of Classification Search
CPC ......... H01L 27/14625; H01L 27/14627; H01L 27/14629
See application file for complete search history.

(56) References Cited

U.S. PATENT DOCUMENTS

2011/0001855 A1* 1/2011 Matsuoka ......... H01L 27/14621
348/340
2011/0157454 A1 6/2011 Matsuoka
(Continued)

FOREIGN PATENT DOCUMENTS

JP 2011-151345 A 8/2011
JP 2015-065268 A 4/2015
(Continued)

OTHER PUBLICATIONS

International Search Report issued Nov. 10, 2020 in PCT/JP2020/032572, filed Aug. 28, 2020, 7 pages (with English Translation).

*Primary Examiner* — Kevin K Pyo
(74) *Attorney, Agent, or Firm* — Oblon, McClelland, Maier & Neustadt, L.L.P.

(57) ABSTRACT

A photoelectric conversion device including a substrate including a charge generation region, a dielectric layer formed on the substrate, and a phase adjustment layer formed on the dielectric layer and having an upper surface and a lower surface. In a cross-sectional view of the photoelectric conversion device, a first plane extends parallel to the substrate in contact with the upper surface of the phase adjustment layer, a second plane is the lower surface of the phase adjustment layer, and the phase adjustment layer is formed such that the reflected light which has entered the first plane perpendicularly to the photoelectric conversion device and travels from the first plane to the second plane has an optical path length that varies depending on a position where the reflected light is incident on the first plane.

20 Claims, 13 Drawing Sheets

(56) References Cited

U.S. PATENT DOCUMENTS

| | | |
|---|---|---|
| 2016/0231468 A1 | 8/2016 | Ootsuka et al. |
| 2018/0366504 A1 | 12/2018 | Jin |
| 2020/0335542 A1 | 10/2020 | Karasawa et al. |

FOREIGN PATENT DOCUMENTS

| | | |
|---|---|---|
| JP | 2017-041590 A | 2/2017 |
| JP | 2019-004149 A | 1/2019 |
| WO | WO 2018/138851 A1 | 8/2018 |
| WO | WO 2018/154627 A1 | 8/2018 |

* cited by examiner

PHOTOELECTRIC CONVERSION DEVICE, IMAGING DEVICE, AND IMAGING SYSTEM

CROSS-REFERENCE TO RELATED APPLICATIONS

The present application is a continuation of International Application No. PCT/JP2020/032572, filed Aug. 28, 2020, which is based upon and claims the benefits of priority to Japanese Application No. 2019-157644, filed Aug. 30, 2019 and Japanese Application No. 2019-157645, filed Aug. 30, 2019. The entire contents of all of the above applications are incorporated herein by reference.

BACKGROUND OF THE INVENTION

Field of the Invention

The present invention generally relates to a photoelectric conversion device, an imaging device, and an imaging system.

Discussion of the Background photoelectric conversion devices are used in various fields. An imaging system capable of distance measurement is known as one of the fields in which photoelectric conversion devices are used.

Such an imaging system generally includes a light source that generates light to be applied to an object, and a photoelectric conversion device. The photoelectric conversion device serves as an image sensor which captures an image of the light reflected from an object.

The photoelectric conversion device includes a silicon substrate having a charge generation region. One or more dielectric layers are formed on the surface of the silicon substrate, and signal wires are arranged in the dielectric layers. In other words, photoelectric conversion devices in general are composed of dielectric multilayer films. Patent Literature: JP-2017-41590 A

SUMMARY OF THE INVENTION

According to an aspect of the present invention, a photoelectric conversion device that receives reflected light that arises from reflection of emitted light on an object, includes a substrate including a charge generation region, a dielectric layer formed on the substrate, and a phase adjustment layer formed on the dielectric layer and having an upper surface and a lower surface. In a cross-sectional view of the photoelectric conversion device, a first plane extends parallel to the substrate in contact with the upper surface of the phase adjustment layer, a second plane is the lower surface of the phase adjustment layer, and the phase adjustment layer is formed such that the reflected light which has entered the first plane perpendicularly to the photoelectric conversion device and travels from the first plane to the second plane has an optical path length that varies depending on a position where the reflected light is incident on the first plane.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
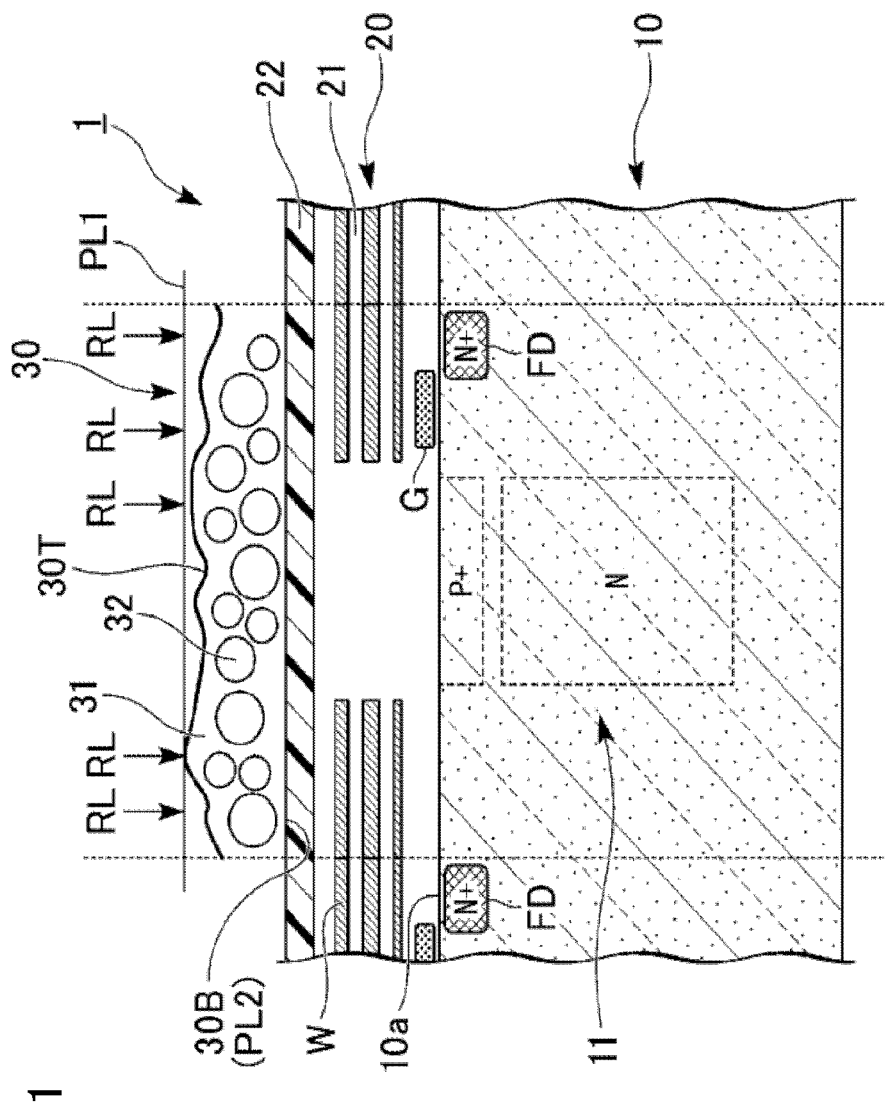
FIG. 1 is a schematic cross-sectional view showing a photoelectric conversion device according to a first embodiment of the present invention.

The embodiments will now be described with reference to the accompanying drawings, wherein like reference numerals designate corresponding or identical elements throughout the various drawings.

First Embodiment

With reference to FIG. 1, a first embodiment of the present invention will be described.

FIG. 1 is a schematic cross-sectional view showing a photoelectric conversion device 1 according to the first embodiment. The photoelectric conversion device 1 includes a substrate 10 made of a semiconductor, a dielectric layer 20 formed on the substrate 10, and a phase adjustment layer 30 formed on the dielectric layer 20.

The substrate 10 is made of, for example, silicon. The substrate 10 has a charge generation region 11 and floating diffusions FD.

The charge generation region 11 has a three-dimensional shape extending from a first plane 10a of the substrate 10 in the plane direction of the first plane 10a and in the thickness direction of the substrate 10. As shown in FIG. 1, the charge generation region 11 has a first conductivity type (P+type) semiconductor region and a second conductivity type (N type) semiconductor region. This structure includes a photodiode having a structure in which electrons corresponding to an amount of light (light quantity) incident on the charge generation region 11 are generated and stored as signal charges. The structure of the charge generation region 11 is known, and may be formed, for example, by implanting impurities (dopant) into the substrate 10.

The dielectric layer 20 has a low refractive index layer 21 in contact with the first surface 10a, and a high refractive index layer 22 located above the low refractive index layer 21. A wiring layer W for connecting the photoelectric conversion device 1 to an external circuit or the like is arranged in the dielectric layer 20, and a gate electrode G is formed on a portion of the wiring layer W. When a potential is applied to the gate electrode G, electrons generated in the charge generation region 11 are transferred to the floating diffusions FD. The basic structure of the gate electrode G and the floating diffusion FD are known.

The phase adjustment layer 30 has an upper surface 30T (surface) and a lower surface 30B, and is formed on the high refractive index layer 22. The upper surface 30T is an incident surface at which light enters. The lower surface 30B is a contact surface where the phase adjustment layer 30 and the high refractive index layer 22 come into contact with each other. The phase adjustment layer 30 has a structure in which scattering particles 32 are dispersed in a transparent base resin 31. The phase adjustment layer 30 has a fine concavo-convex shape on the upper surface 30T.

Both transparent particles and opaque particles can be used for the scattering particles 32, but when opaque particles are used, it should be noted that if the ratio of the scattering particles 32 in the phase adjustment layer 30 is too high, the incident light will be excessively reduced. When transparent particles are used, it is necessary that the refractive index is different from that of the base resin 31.

Examples of scattering particles having transparency include silica particles. Examples of opaque scattering particles include titania particles.

In a cross-sectional view of the photoelectric conversion device 1, a plane which extends parallel to the substrate 10 in contact with the upper surface 30T of the phase adjustment layer 30 is defined as a first plane PL1, and the lower surface 30B of the phase adjustment layer 30 is defined as a second plane PL2. In this case, the phase adjustment layer 30 is configured such that an optical path through which the reflected light RL which has entered the first plane PL1 perpendicularly to the photoelectric conversion device 1 travels from the first plane PL1 to the second plane PL2 has a length which is different depending on the position (position indicated by reference symbol RL in FIG. 1) where the reflected light RL is incident on the first plane PL1.

The behavior of light incident on the photoelectric conversion device 1 of the first embodiment configured as described above will be described.

Light incident on the photoelectric conversion device 1 enters the phase adjustment layer 30 before reaching the dielectric layer. A portion of the light incident on the phase adjustment layer 30 hits the scattering particles 32, and this changes the light path in various directions, resulting in light having various optical path lengths. As a result, a phase difference is generated due to a change in the optical path length between the light hitting the scattering particles 32 and the light not hitting the scattering particles 32. A phase difference is further generated within the light that hits the scattered particles 32.

The light emitted from the phase adjustment layer 30 enters the high refractive index layer 22 at various angles of incidence. This difference in the angle of incidence also changes the optical path length and causes a phase difference.

In the dielectric layer 20, interference occurs due to the multilayer structure of the low refractive index layer 21 and the high refractive index layer 22, which leads to variation in the reflectance. However, light that passes through the phase adjustment layer 30 and enters the high refractive index layer 22 includes a plurality of types of light each of which has an optical path length different from each other as described above. Therefore, some of the variations are cancelled out due to the phase difference, which then results in reducing the amplitude.

As a result, the amplitude of the interference variation in the dielectric layer 20 is reduced compared to the case without the phase adjustment layer 30. Therefore, the amplitude of the interference variation can be reduced very easily without considering the film thickness and the material of the low refractive index layer 21 and the high refractive index layer 22. As a result, a single pixel imaging system suppresses the variation in sensitivity between products, and a multi pixel imaging system suppresses the variation in sensitivity between pixels. In either case, the configuration of the second embodiment having the phase adjustment layer 30 contributes to stabilizing the accuracy in distance measurement.

Whether the phase adjustment layer 30 can reduce the amplitude of the interference variation depends on the wavelength of the incident light. In other words, the interference variations of light in which phases are different by ½ period cancel each other out. In order to increase the optical path length by ½ wavelength in a round trip, the phase adjustment layer 30 is required to be designed so that the light passing through the phase adjustment layer 30 includes light having an optical path length increased by ¼ wavelength or more.

For example, when the photoelectric conversion device 1 of the first embodiment is applied to an imaging system which uses light having a wavelength in the near infrared region, the phase adjustment layer 30 is required to be designed so that the light passing through the phase adjustment layer 30 includes light having an optical path length increased by approximately 190 nm to 350 nm or more, depending on the specific wavelength of the light emitted from the light source.

As an example of the design of the phase adjustment layer 30, the scattering by the scattering particles 32 is preferably forward scattering in order to increase the transmittance. Forward scattering may be geometric scattering or Mie scattering. However, in either case, the light scattered outside the pixel region increases as the phase adjustment layer 30 becomes thicker. Therefore, from the viewpoint of forming a thin phase adjustment layer 30, the particle size of the scattering particles 32 is preferably small, for example, preferably 3 μm or less, and more preferably 1.5 μm or less.

On the other hand, if the particle shape of the scattering particles 32 is sufficiently small with respect to the wavelength, Rayleigh scattering occurs, which is not preferable because it increases the back-scattering component. Therefore, in the region of near-infrared light, the particle size of the scattering particles 32 is preferably 10 nm or more, and more preferably 0.1 μm or more.

Second Embodiment

With reference to FIGS. 2 to 5, a second embodiment of the present invention will be described. In the following description, components that are common to those described above are denoted by the same reference signs, and repeated description thereof will be omitted.

Figure 2:
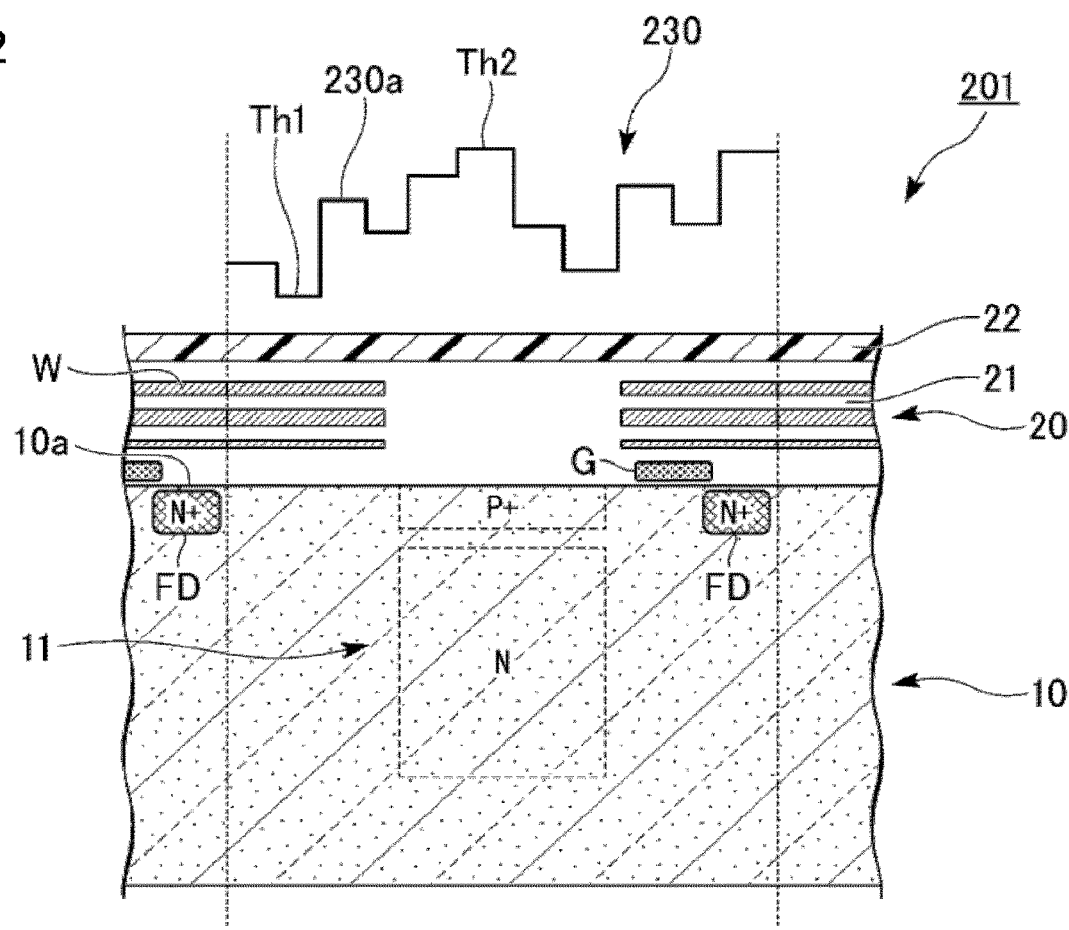
FIG. 2 is a schematic cross-sectional view showing a photoelectric conversion device according to a second embodiment of the present invention.
Figure 3:
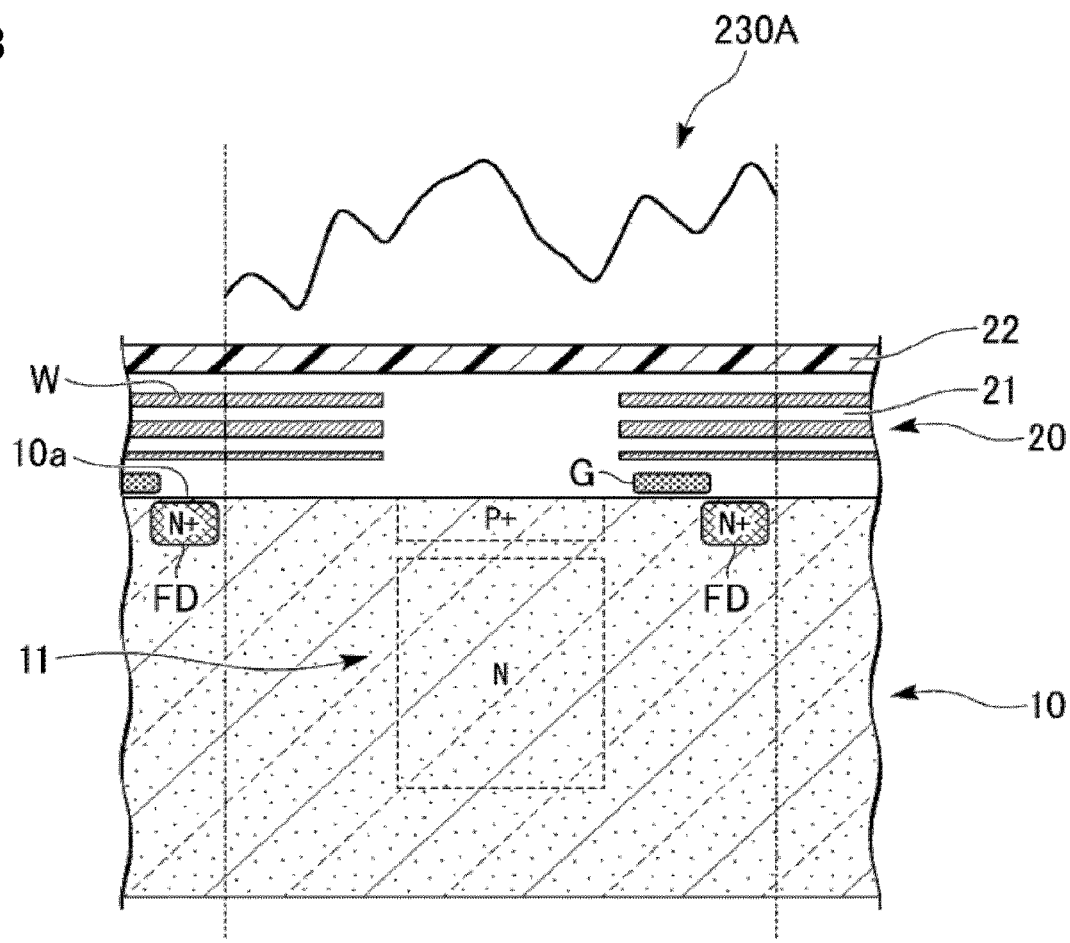
FIG. 3 is a schematic cross-sectional view showing another example of a phase adjustment layer of the photoelectric conversion device according to the first embodiment and the second embodiment.
Figure 4:
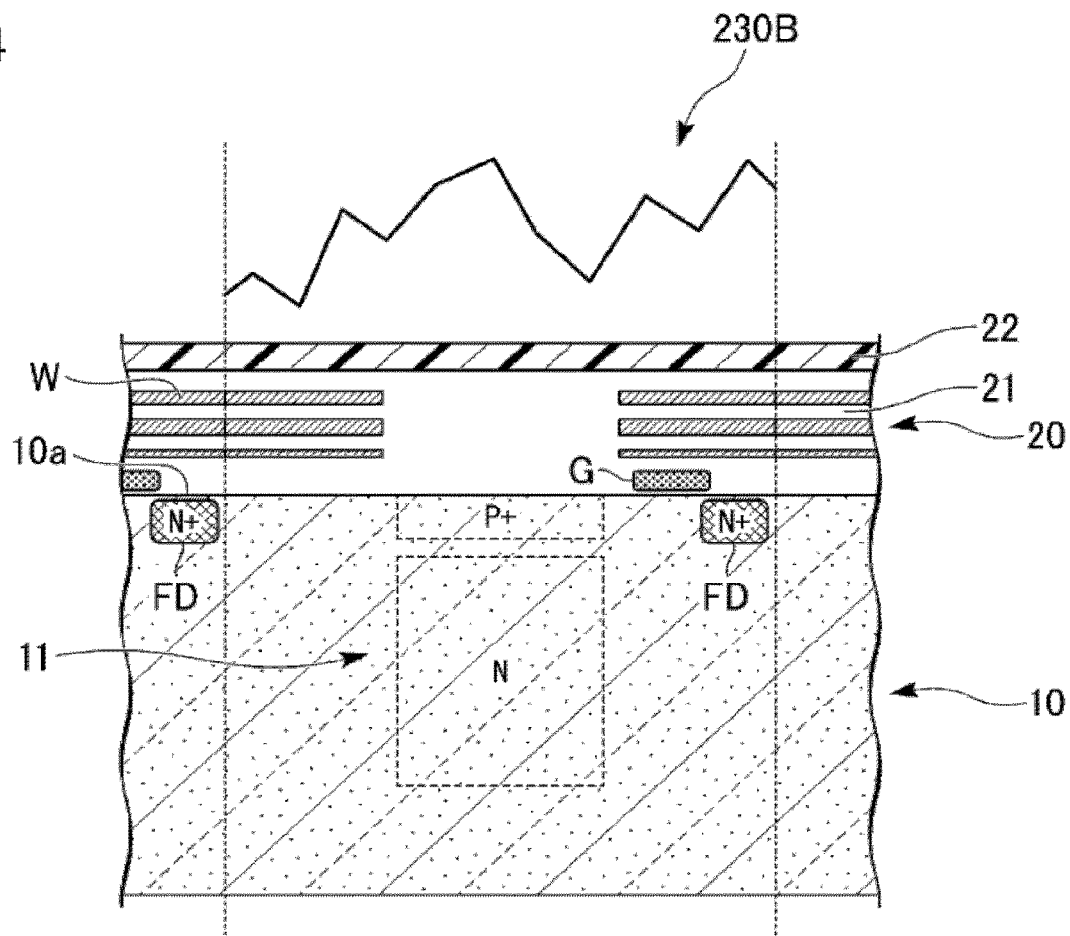
FIG. 4 is a schematic cross-sectional view showing another example of the phase adjustment layer of the photoelectric conversion device according to the first embodiment and the second embodiment.
Figure 5:
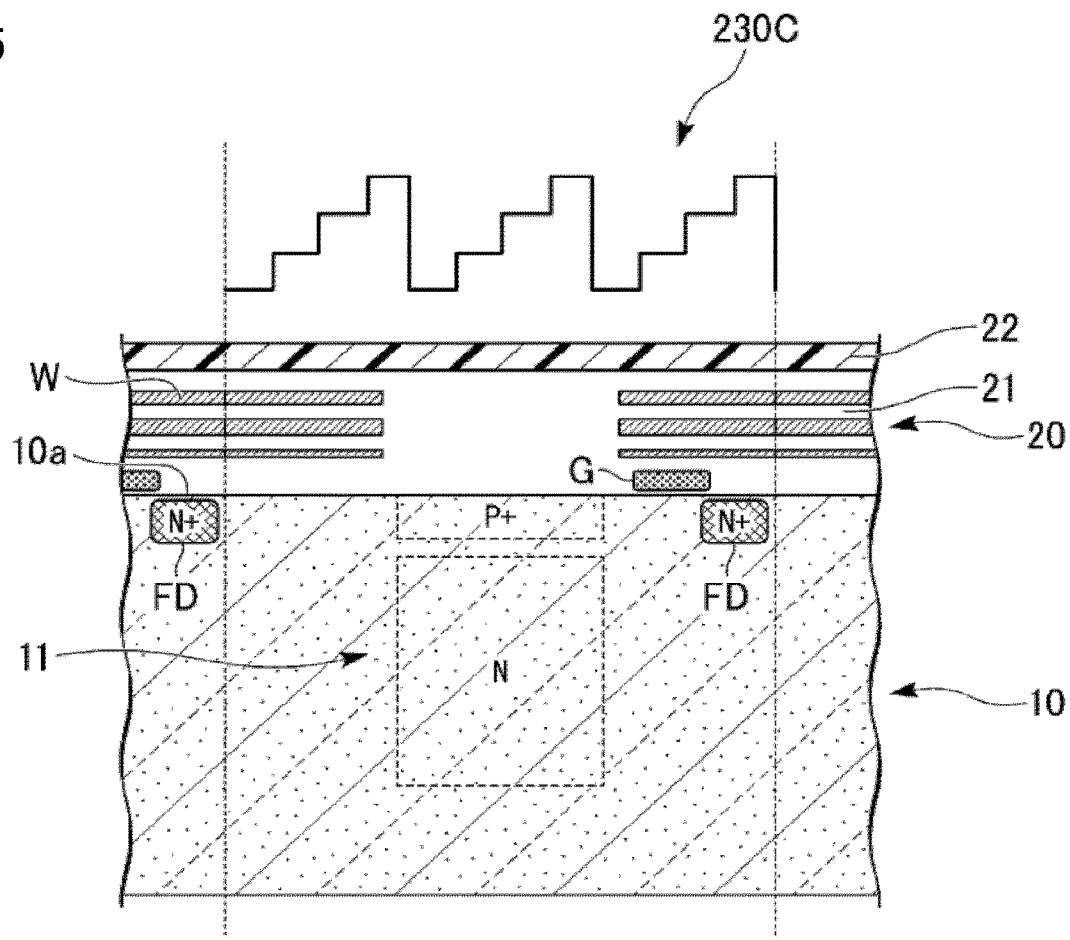
FIG. 5 is a schematic cross-sectional view showing another example of the phase adjustment layer of the photoelectric conversion device according to the first embodiment and the second embodiment.

FIG. 2 is a schematic cross-sectional view showing a photoelectric conversion device 201 according to the second embodiment. The phase adjustment layer 230 formed on the dielectric layer 20 does not include the scattering particles, and has on the surface 230a thereof a fine concavo-convex shape. In other words, the material of the phase adjustment layer 230 is uniform, but the thickness is different for each portion due to the fine concavo-convex shape. Therefore, the phase adjustment layer 230 has a plurality of kinds of thickness dimensions.

Therefore, the phase adjustment layer 230 is set so that the difference between the thickness dimension Th1 of the thinnest portion and the thickness dimension Th2 of the thickest portion is ¼ or more of the wavelength of the light emitted from the light source, to thereby reduce the amplitude of the interference variation in a very simple way as in the first embodiment.

The structure of the second embodiment having the fine concavo-convex shape may be set as appropriate. Examples of the structures may include a stepped structure like the phase adjustment layer 230 in which areas having a fixed thickness are provided, or a step-free structure like the phase adjustment layer 230A shown in FIG. 3 in which thickness in a predetermined cross section varies continuously and smoothly. In the case of a step-free structure, the thickness may vary continuously and linearly in a predetermined cross section, as in the phase adjustment layer 230B shown in FIG. 4.

Figure 6:
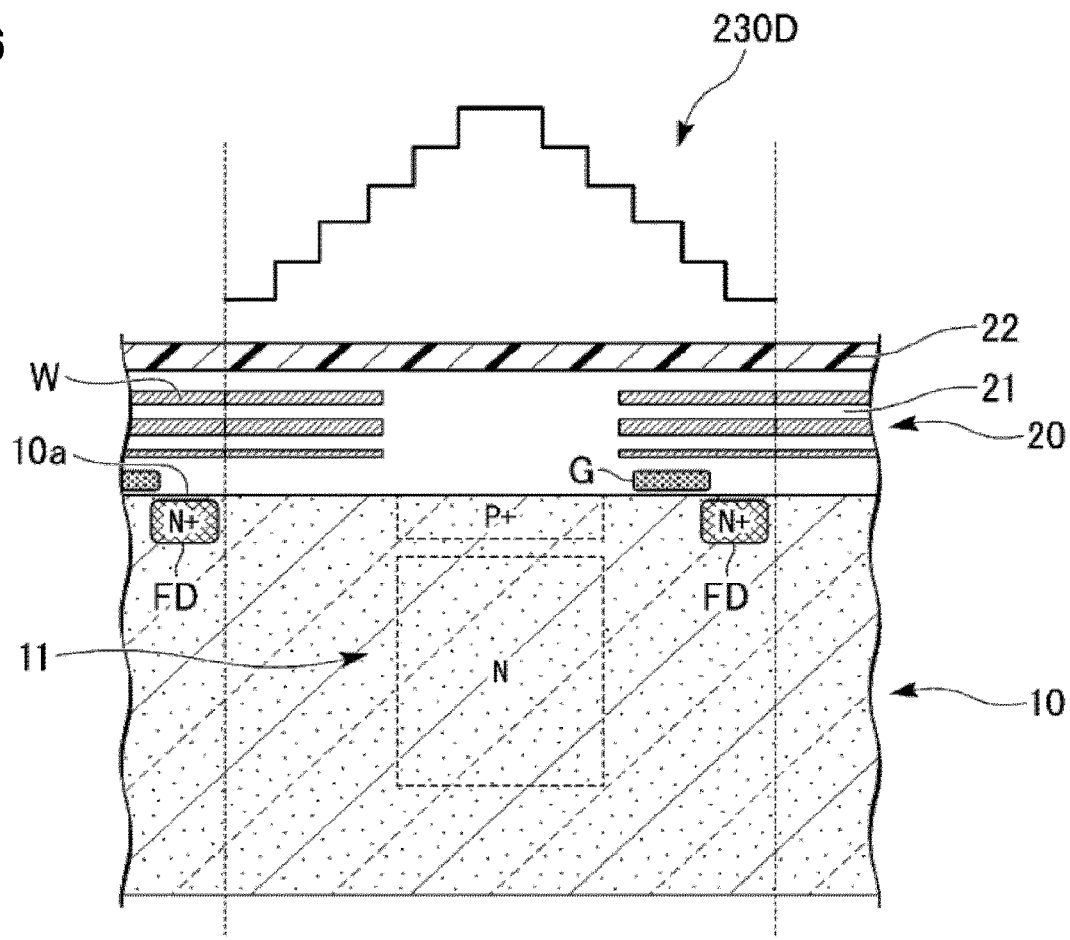
FIG. 6 is a schematic cross-sectional view showing another example of the phase adjustment layer of the photoelectric conversion device according to the first embodiment and the second embodiment.
Figure 7:
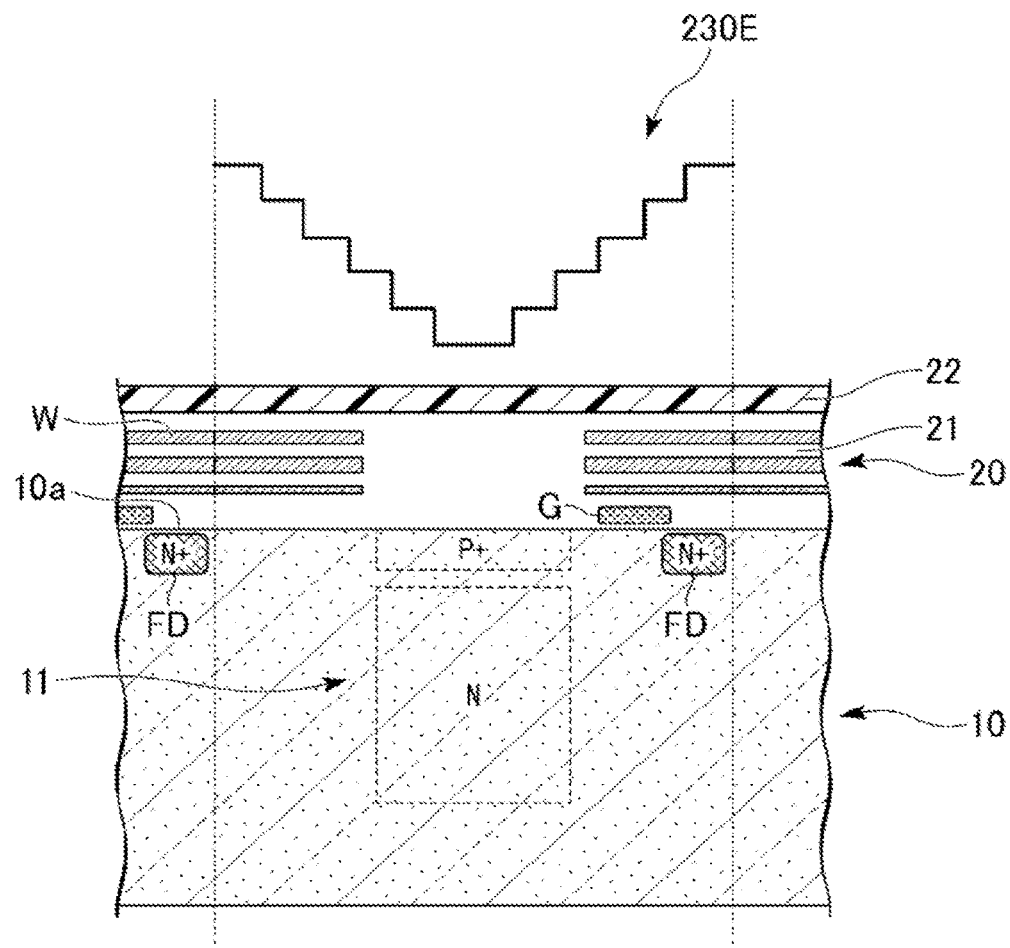
FIG. 7 is a schematic cross-sectional view showing another example of the phase adjustment layer of the photoelectric conversion device according to the first embodiment and the second embodiment.

There is no particular limitation on the structure in which the thickness increases or decreases. Accordingly, the structure may be such that the increase or decrease in thickness is repeated in a predetermined cycle as in the phase adjustment layer 230C shown in FIG. 5, or a structure in which the thickness increases or decreases so as to be line-symmetric in a predetermined cross section of the photoelectric conversion device 1 as in the phase adjustment layer 230D shown in FIG. 6 or in the phase adjustment layer 230E or the like shown in FIG. 7.

The inventors have found an effect of reducing the amplitude described above (hereinafter referred to as amplitude reduction effect) by disposing the phase adjustment layer 230 above the dielectric layer 20, and have conducted a study to enhance the effect, by simulation. The details will be described below.

Figure 8:
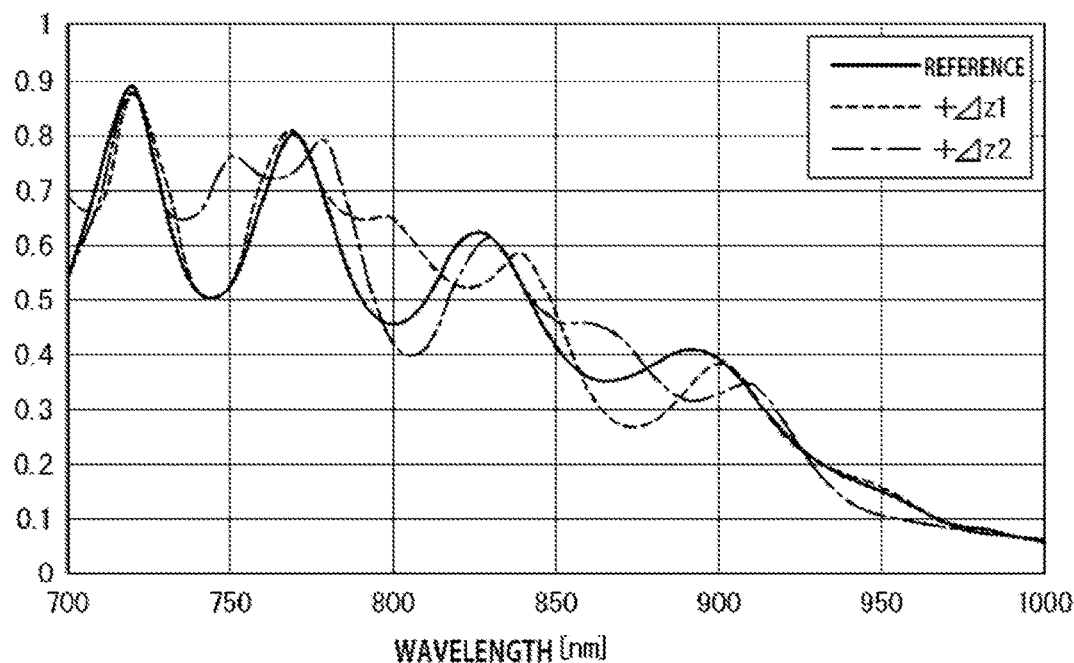
FIG. 8 is a graph showing the effect of a change in thickness of the phase adjustment layer on the amount of light absorption in the photoelectric conversion device according to the first embodiment and the second embodiment.

FIG. 8 is a graph showing a change in the amount of light absorbed by the photoelectric conversion device 201 when the thickness of the phase adjustment layer 230, arranged on the dielectric layer 20, is increased by 0.2 μm.

The photoelectric conversion device 201 is formed in a square (23.8 μm diagonal) having a side length of 16.8 μm. FIG. 8 shows the amount of light absorbed in a range from the first surface 10a side of the substrate 10 to a depth of 13 μm.

As shown in FIG. 8, the phase adjustment layer having the reference thickness shows a drop in the amount of light absorption around the wavelength of 750 nm and around the wavelength of 800 nm. In contrast, "+Δz1", which is 0.2 μm thicker than the reference thickness, shows no drop in the amount of light absorption around the wavelength of 800 nm. In the case of "+Δz2", which is 0.4 μm thicker than the reference thickness, no drop in the amount can be confirmed around the wavelength of 750 nm.

FIG. 8 indicates that by providing a region having a plurality of thicknesses in the phase adjustment layer, the drops in the amount of light absorption complement each other, which leads to suppressing the interference amplitude of light absorption accompanying the wavelength.

In contrast, FIG. 8 also indicates that the change in only the thickness of the phase adjustment layer 230 does not lead to significantly changing the peak value of the interference amplitude of the light absorption amount. This is because the change in the thickness of the phase adjustment layer 230 does not cause the optical path length in the dielectric layer 20 to change.

Therefore, a change in the optical path length in the dielectric layer 20 is effective in suppressing peak portions of the interference amplitude. In order to change the optical path length in the dielectric layer 20, it is necessary to create a plurality of types of angles of incidence of light on the dielectric layer. Specifically, it is preferable to continuously change the thickness of the phase adjustment layer, as in the phase adjustment layers 230A and 230B described above.

The continuous change in the thickness of the phase adjustment layer results in the generation of a slope in a portion of the surface of the phase adjustment layer. The light incident on the slope is refracted and travels obliquely through the dielectric layer 20, thus changing the optical path length.

Figure 9:
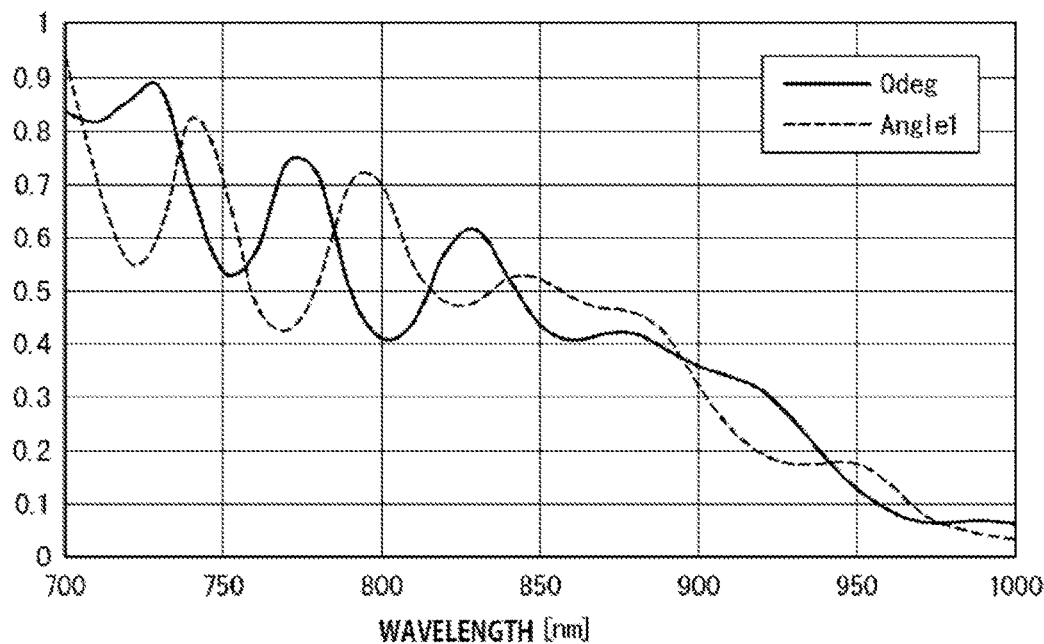
FIG. 9 is a graph showing the effect of the change in the angle at which light is incident on the dielectric layer on the amount of light absorption.

The simulation result shown in FIG. 9 shows that the amplitude is substantially reversed when the angle of incidence changes by approximately 17 degrees in the low refractive index layer 21 (Angle 1).

Therefore, by having a plurality of portions having different thicknesses in the phase adjustment layer and continuously changing the thickness between the portions, both the interference suppression effect due to change in thickness and the interference suppression effect due to change in optical path length in the dielectric layer 20 can be achieved.

As another example, even if the incident light is diffracted by the concavo-convex structure of the phase adjustment layer, the angle of the light incident on the dielectric layer 20 can be changed. In this case, the period of the concavo-convex structure is 5 μm or less, or preferably 3 μm or less.

The photoelectric conversion devices according to the embodiments of the second embodiment can be used alone, but a plurality of photoelectric conversion devices may be arranged in a two-dimensional matrix to form an imaging device.

Figure 10:
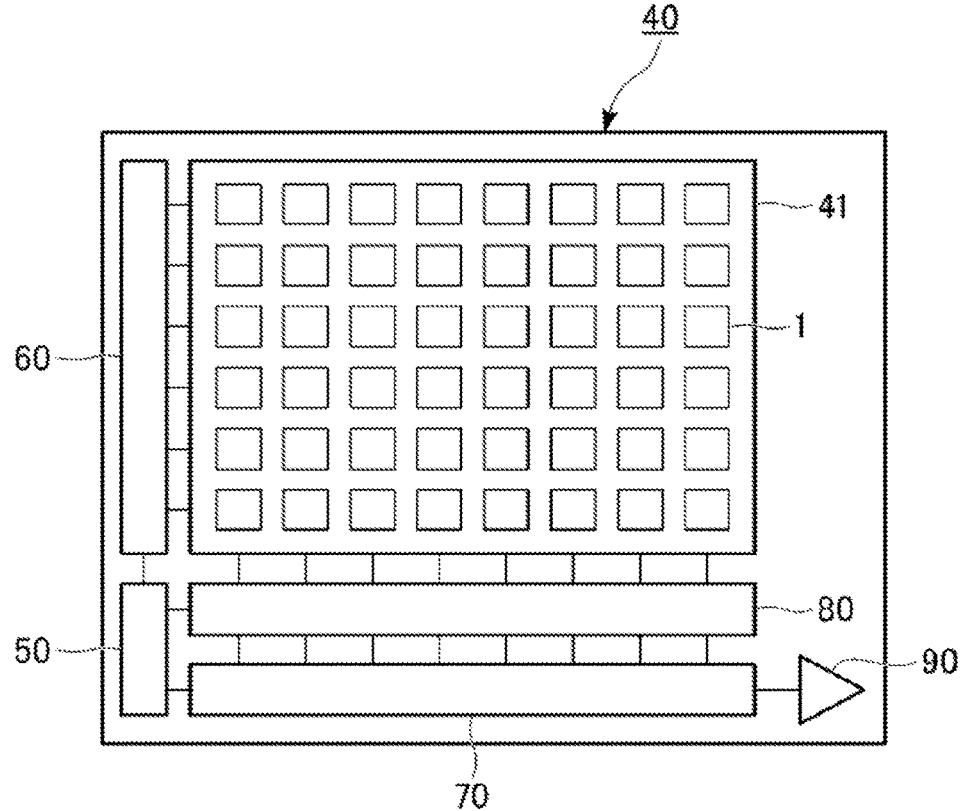
FIG. 10 is a diagram showing an example of the imaging device to which the photoelectric conversion device according to the first embodiment and the second embodiment is applied.

FIG. 10 is a block diagram showing an example of an imaging device. The imaging device 40 has a light receiving region 41 in which a plurality of photoelectric conversion devices 1 are two-dimensionally arranged. The imaging device 40 includes a control circuit 50, a vertical drive circuit 60, a horizontal drive circuit 70, an AD conversion circuit 80, and an output circuit 90. Since this structure is merely an example of an imaging device, various known configurations may be combined as appropriate in consideration of specifications and the like. Rather than the photoelectric conversion device 1, the photoelectric conversion device 201 may be used instead.

The imaging device 40 may be configured such that the number of the photoelectric conversion devices and the arrangement of the photoelectric conversion devices disposed in the light receiving region 41 are appropriately set. The plurality of photoelectric conversion devices may be two-dimensionally arranged without gaps in between. In this case, a plurality of photoelectric conversion devices in a two-dimensional array may be formed on a single semiconductor wafer.

Figure 11:
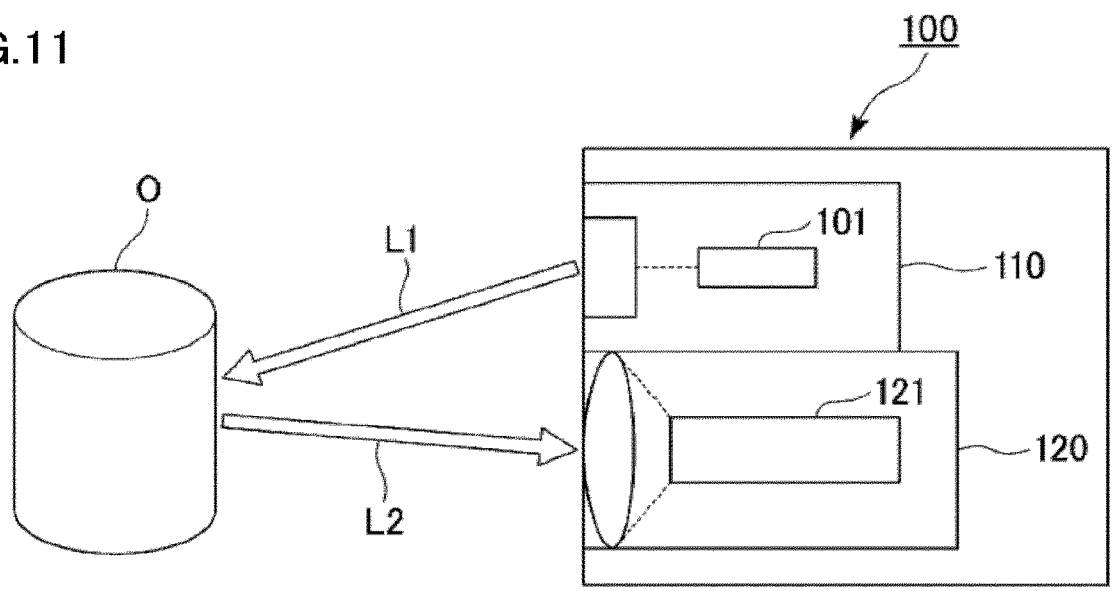
FIG. 11 is a diagram showing an example of an imaging system to which the photoelectric conversion device according to the first embodiment or the second embodiment is applied.

FIG. 11 schematically shows an example of an imaging system to which the photoelectric conversion device of the present embodiment is applied. The imaging system 100 shown in FIG. 11 includes a light emitting section 110 having a light source 101, and a light receiving section 120 having an image sensor 121. The light source 101 emits emitted light L1 having a predetermined wavelength and the wavelength band (wavelength profile) toward the object O. The emitted light L1 is light emitted from the light source 101. The reflected light L2 generated due to the reflection of the emitted light L1 on the object O enters the image sensor 121 of the light receiving unit 120. As the image sensor 121, a single photoelectric conversion device or an imaging device 40 having a plurality of photoelectric conversion devices 301 may be applied.

By designing the phase adjustment layer in the image sensor 121 based on the wavelength band of the emitted light L1, an imaging system having less variation in accuracy of distance measurement is formed.

(Modifications)

The phase adjustment layer is not limited to the embodiments described above.

Figure 12:
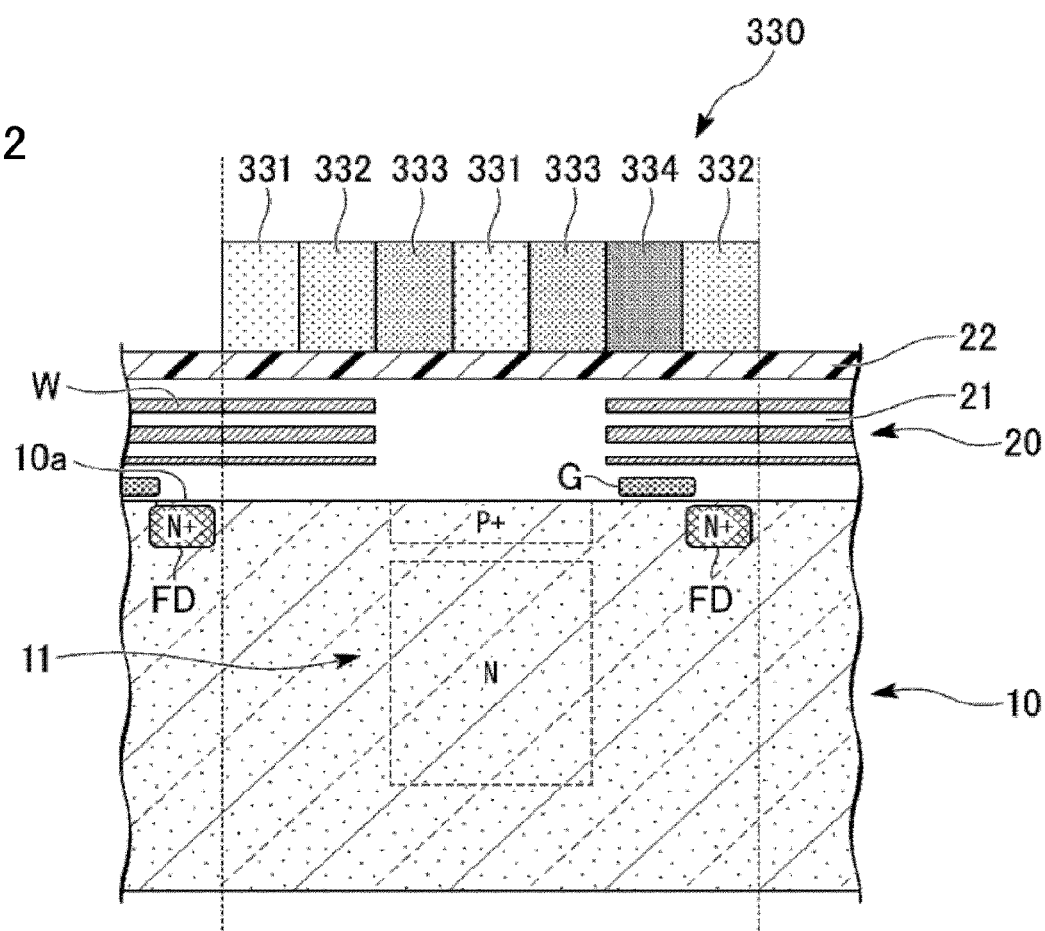
FIG. 12 shows a diagram of the phase adjustment layer according to a modification of the first embodiment and the second embodiment of the present invention.

The phase adjustment layer 330 of a modification shown in FIG. 12 includes a first region 331, a second region 332, a third region 333, and a fourth region 334 all having different refractive indices to each other. Since light transmitted through each region having different refractive indices to each other has a substantially different optical path length to each other, even if the thickness of all the regions of the phase adjustment layer 330 is the same, by setting the refractive index of each region appropriately based on the light-source wavelength or the like, the amplitude reduction effect can be obtained. The number of regions and arrangement of regions may be set as appropriate. For example, the refractive indices may be arranged to gradually increase or decrease, or may be arranged in an irregular manner as shown in FIG. 12.

Figure 13:
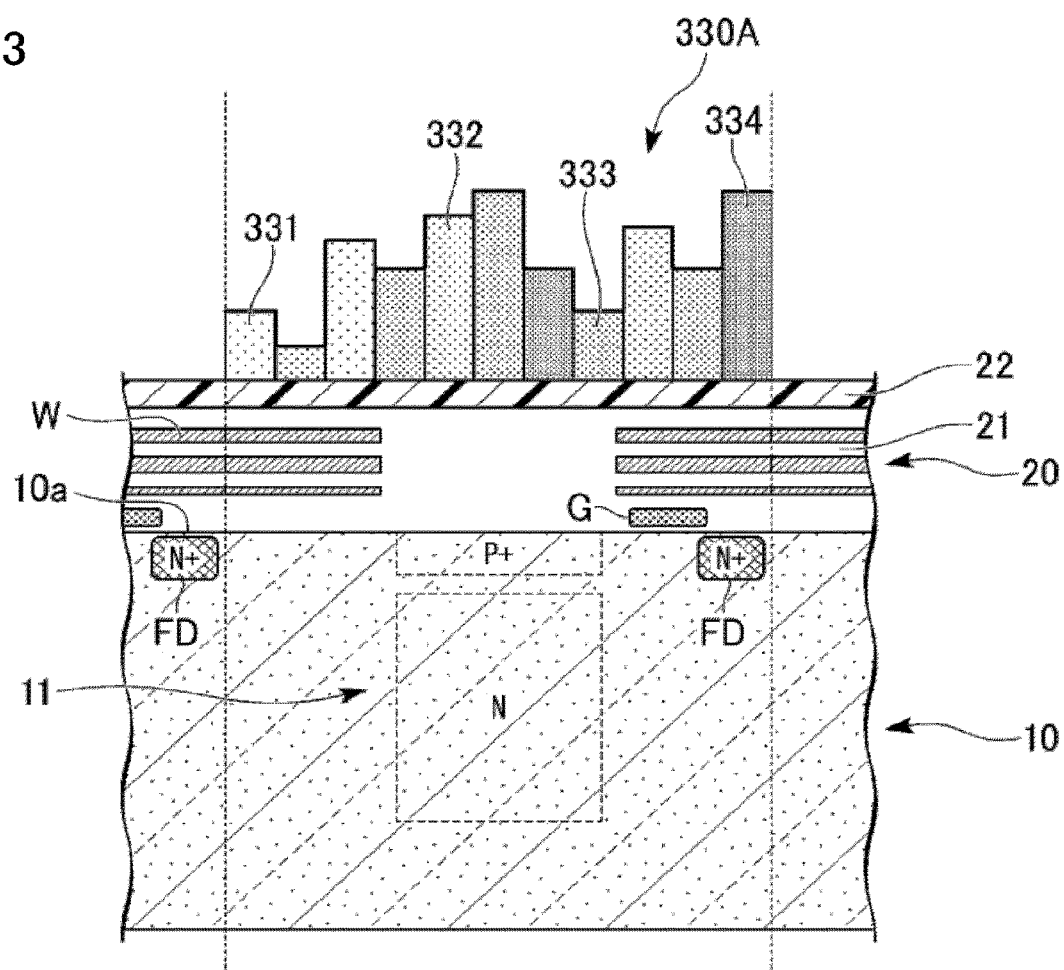
FIG. 13 shows a diagram of the phase adjustment layer according to a modification of the first embodiment and the second embodiment of the present invention.

As in the phase adjustment layer 330A shown in FIG. 13, the amplitude reduction effect can be enhanced by varying the thickness of each of the regions 331 to 334, or by continuously changing the thickness of the regions 331 to 334.

Figure 14:
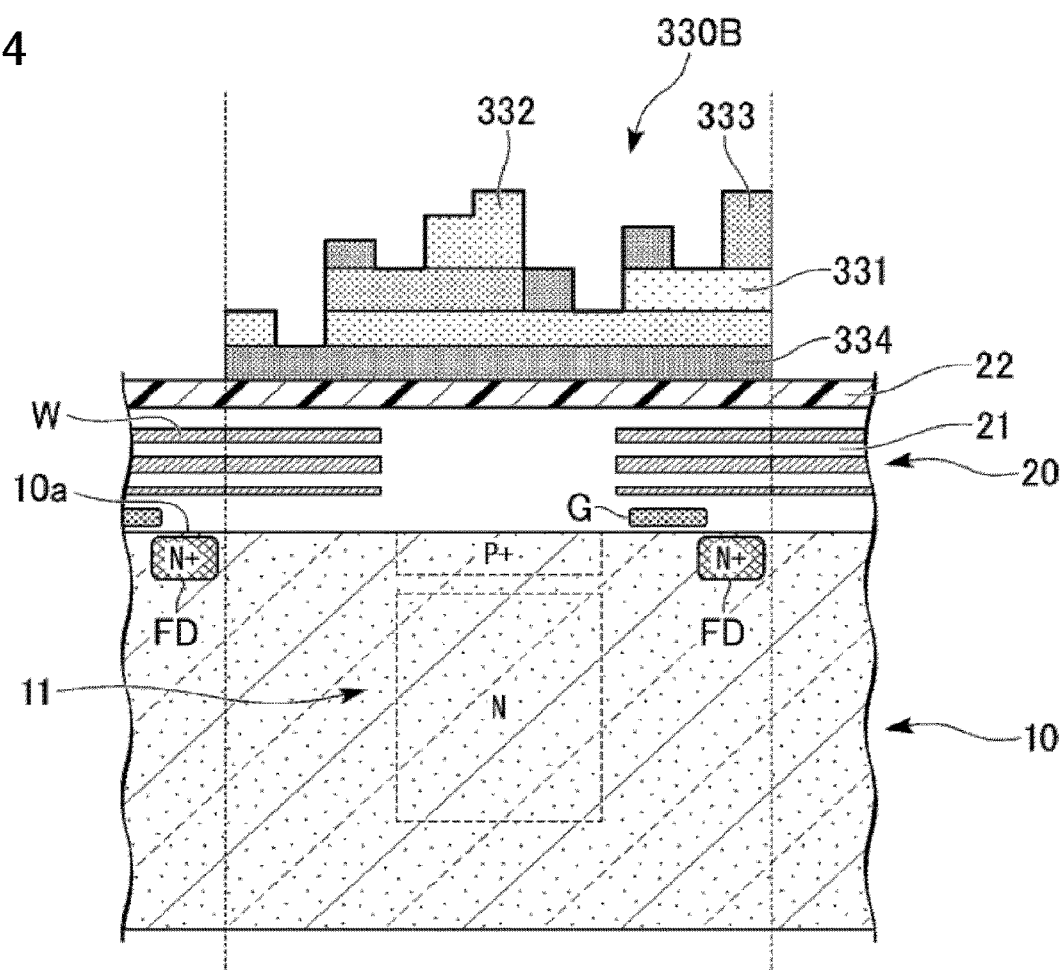
FIG. 14 shows a diagram of the phase adjustment layer according to a modification of the first embodiment and the second embodiment of the present invention.

As in the phase adjustment layer 330B shown in FIG. 14, the regions 331 to 334 may be placed on top of each other in the thickness direction of the phase adjustment layer.

The scattering particles 32 may be included in the phase adjustment layer 230 or the phase adjustment layer 330.

Third Embodiment

Figure 15:
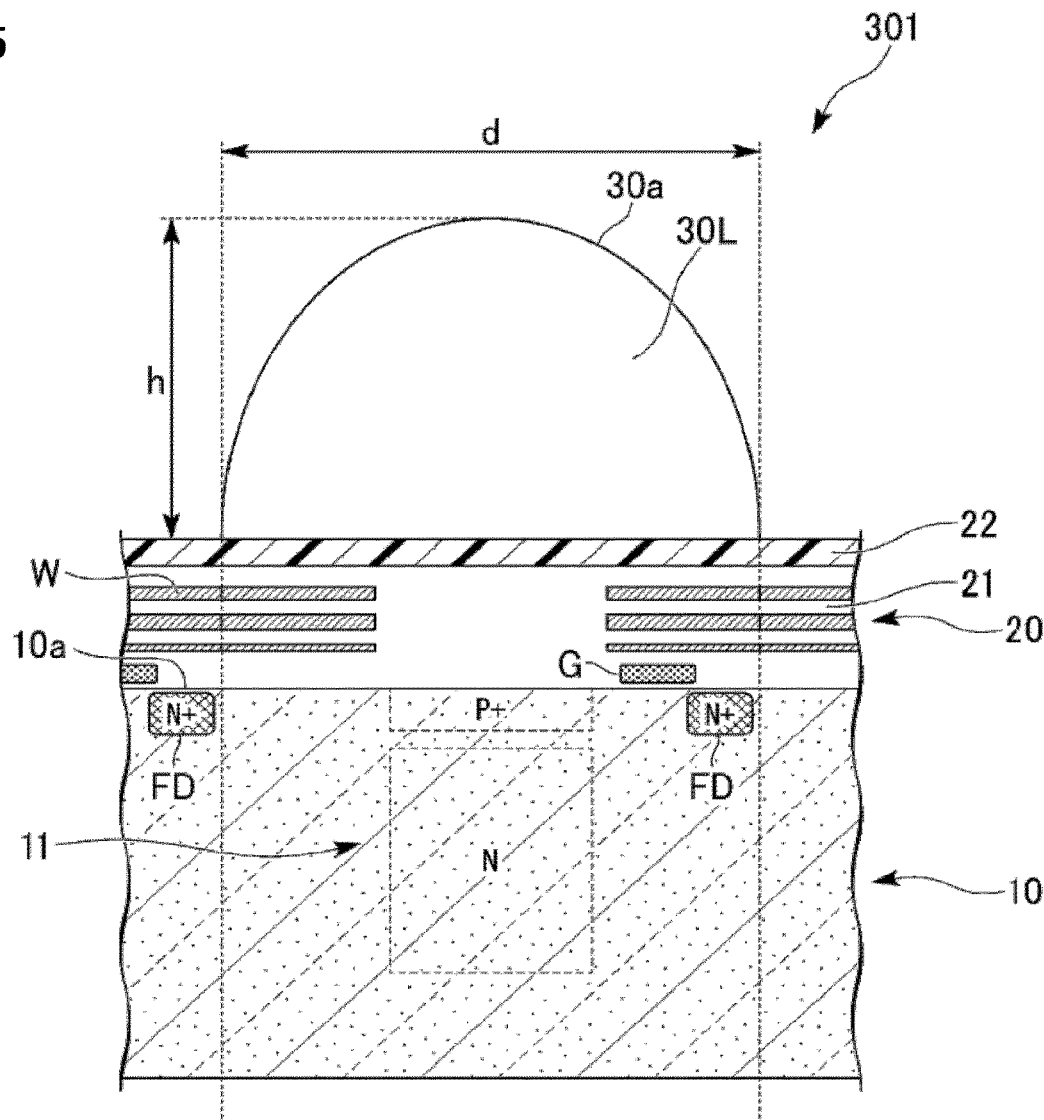
FIG. 15 is a schematic sectional view showing a photoelectric conversion device according to a third embodiment of the present invention.
Figure 16:
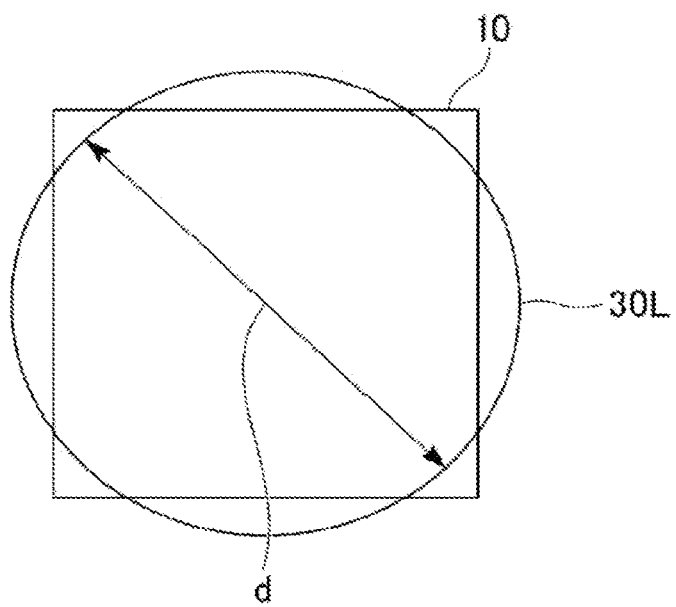
FIG. 16 is a diagram showing a simulation condition for a phase adjustment lens of the photoelectric conversion device according to the third embodiment of the present invention.
Figure 17:
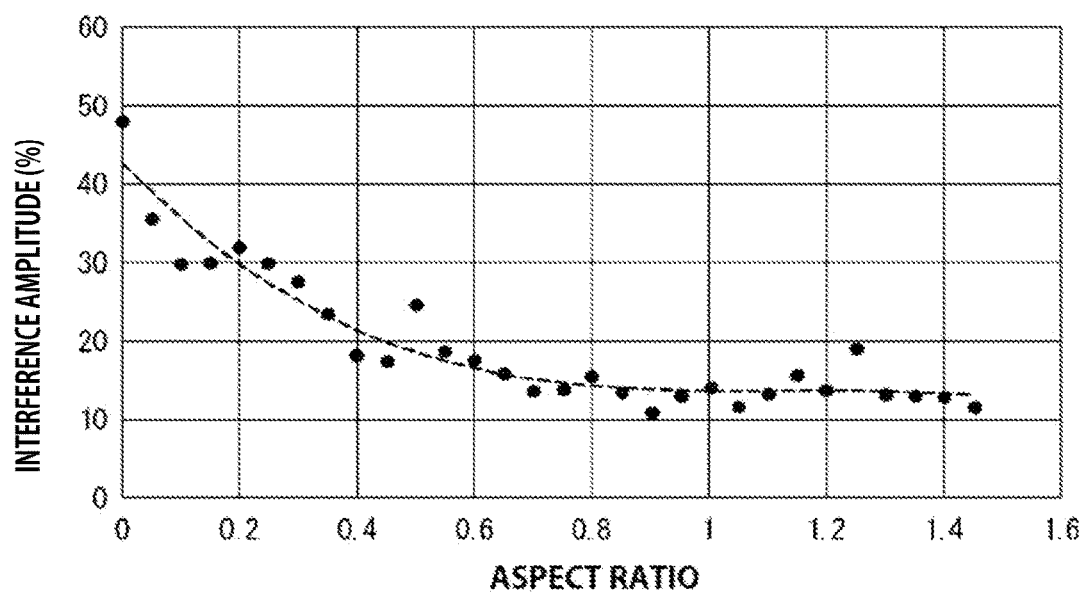
FIG. 17 is a graph showing a simulation result of the phase adjustment lens according to the third embodiment of the present invention.

With reference to FIGS. 15 to 17, a third embodiment of the present invention will be described.

FIG. 15 is a schematic cross-sectional view showing a photoelectric conversion device 301 according to the third embodiment. The photoelectric conversion device 301 includes a substrate 10 made of a semiconductor, a dielectric layer 20 formed on the substrate 10, and a phase adjustment lens 30L formed on the dielectric layer 20. The phase adjustment lens 30L corresponds to the phase adjustment layer.

The phase adjustment lens 30L is disposed on the high refractive index layer 22.

The phase adjustment lens 30L of the third embodiment has an aspect ratio of a bottom diameter d to a height h (h/d) of 0.6 or more and 1.0 or less. Although the microlens having such an aspect ratio is not known, it can be produced using known microlens technology by setting appropriate production conditions.

In the case of the shape of a phase adjustment lens 30L in plan view being a square due to the arrangement or the like of the phase adjustment lens 30L, the diagonal length of the square may be shorter than the diameter of a phase adjustment lens 30L having a circular shape. If so, the curved surface on the upper area of the phase adjustment lens 30L is extended to the bottom surface of the phase adjustment lens 30L to define the diameter of the shape of the phase adjustment lens 30L as the bottom diameter d.

The behavior of light incident on the photoelectric conversion device 301 of the third embodiment configured as described above will be described.

The light incident on the photoelectric conversion device 301 enters the lens surface 30a of the phase adjustment lens 30L at various angles of incidence before reaching the dielectric layer 20 and thus the optical path lengths vary. Hence, the light enters the high refractive index layer 22 in a state where a phase difference is generated between the light entering the phase adjusting lens 30L.

In the dielectric layer 20, interference occurs due to the multilayer structure of the low refractive index layer 21 and the high refractive index layer 22, which leads to variation in the reflectance. However, the light entering the high refractive index layer 22 from the phase adjustment layer 30L contains light having various phases. Therefore, some of the variations are cancelled out, which then results in reducing the amplitude.

As described above, the amplitude of the interference variation in the dielectric layer 20 is reduced as compared with the case where the phase adjustment lens 30L is not provided. Therefore, the amplitude of the interference variation can be reduced very easily without considering the film thickness and the material of the low refractive index layer 21 and the high refractive index layer 22. As a result, a single pixel imaging system suppresses the variation in sensitivity between products, and a multi pixel imaging system suppresses the variation in sensitivity between pixels. In either case, the configuration of the third embodiment having the phase adjustment lens 30L contributes to stabilizing the accuracy in distance measurement.

Whether the phase adjustment lens 30L can reduce the amplitude of the interference oscillation depends on the wavelength of the incident light. In other words, the interference variations of the light whose phases are different by ½ period cancel each other out. In order to increase the optical path length by ½ wavelength in a round trip, the phase adjustment lens 30L is required to be designed so that light passing through the phase adjustment lens 30L includes the light having an optical path length increased by ¼ wavelength or more.

For example, when the photoelectric conversion device 301 of the present embodiment is applied to an imaging system which uses light having a wavelength in the near infrared region, the lens shape of phase adjustment lens 30L is required to be designed so that the light passing through the phase adjustment lens 30L includes light having an optical path length increased by approximately 190 nm to 350 nm or more, depending on the specific wavelength of the light emitted from the light source.

The inventors have found the amplitude reduction effect by disposing the phase adjustment lens 30L on the dielectric layer 20, and have conducted a study to enhance the effect, by simulation. The details will be described below.

FIG. 16 shows the dimensions of the photoelectric conversion device 301 in plan view under simulation conditions. The shape and dimensions of the photoelectric conversion device 301 in plan view were set as a square having a side length of 16.8 μm (diagonal length of 23.8 μm). The bottom diameter d of the phase adjustment lens 30L was set to 20.0 μm. The phase adjustment lens 30L is arranged so that the optical axis of the phase adjustment lens 30L coincides with the center of the photoelectric conversion device 301 in plan view. Approximately 95% of the substrate 10 was covered with the phase adjustment lens 30L.

The wavelength of the light incident on the photoelectric conversion device 301 was set to 800 nm to 900 nm, and the height h of the phase adjustment lens 30L was varied to study the change in the amplitude reduction effect. The amount of light absorbed (light absorption amount) in a range from the first surface 10a side of the substrate 10 to a depth of 13 μm was used as an index.

The results are shown in FIG. 17. In FIG. 17, the horizontal axis indicates the aspect ratio of the phase adjustment lens 30L, and the vertical axis indicates the ratio of the amplitude to the average wavelength of the incident light. In the case where the phase adjustment lens 30L was not provided, the amount of light absorbed in the substrate varied in a range of approximately 50% of the average wavelength of the incident light of 850 nm.

Provision of the phase adjustment lens 30L causes the amplitude to be reduced. The amplitude reduction effect increased as the aspect ratio of the phase adjustment lens 30L increased. When the aspect ratio was 0.35, the amplitude was reduced to approximately ½ of the amplitude in the case where the phase adjustment lens 30L was not provided.

When the aspect ratio was further increased, the amplitude reduction effect was further increased. However, the increase in the amplitude reduction effect became slower after the aspect ratio exceeds 0.6, at which the amplitude reduction effect reduced to approximately ⅓.

An increase in the aspect ratio of the phase adjustment lens 30L means that the thickness of the phase adjustment lens 30L and the range of the lens surface tangent angle which increases the optical path length of the incident light due to optical refraction are increased. As a result, interference is canceled and the effect of reducing the amplitude of interference is enhanced. However, an increase in the thickness of the phase adjustment lens 30L causes the aspect ratio to increase accordingly, but when the aspect ratio exceeds 0.5, the range of the lens surface tangent angle does not increase any further.

Of the range of the lens surface tangent angles of the phase adjustment lens 30L having an aspect ratio of 0.5, high angle components occupy a small percentage of the range. In the range of the aspect ratio between 0.5 to 0.6, the high angle components of the tangential line of the lens surface start to increase and thus the effect of reducing the amplitude of interference increases accordingly. However, around the point when the aspect ratio exceeds 0.6, the increase in the high angle components of the tangential line of the lens surface starts to become excessive, and the effect of reducing the amplitude of interference started to slow down.

When the aspect ratio exceeded 0.7, the increase in the effect became more slower, and the effect was saturated at an aspect ratio of 1.0. Accordingly, producing a phase adjustment lens having an aspect ratio of more than 1.2 is substantially difficult.

In view of both the ease of producing the phase adjustment lens and the amplitude reduction effect, the aspect ratio of the phase adjustment lens 30L may preferably be 0.35 or more and 1.2 or less, and more preferably be 0.6 or more and 1.0 or less.

In the example shown in FIG. 16, the coverage (ratio that the phase adjustment lens covers the substrate in plan view of the photoelectric conversion device) of the phase adjustment lens 30L was approximately 95%. The effect is obtained by the phase adjustment lens 30L having a coverage of at least 75% or more. The phase adjustment lens 30L completely covering the charge generation region 11 in plan view of the photoelectric conversion device 301 is more preferred.

The area occupied by the charge generation region 11 in the substrate 10 varies depending on the layout design of the pixels that make up the photoelectric conversion device 301. However, the occupied area is generally about 30% to 50% in plan view of the photoelectric conversion device 301.

On the other hand, the shape of the charge generation region 11 in plan view can be a square, rectangle, trapezoid, or any other shape depending on the layout design of the pixels. Therefore, the coverage of the phase adjustment lens 30L is preferably 75% or more.

For example, if the phase adjustment lens 30L having a circular bottom surface is covered with a coverage of approximately 75% on the photoelectric conversion device 301, which is square in plan view, the phase adjustment lens 30L is approximately inscribed in the square photoelectric conversion device 301. Therefore, the phase adjustment lens 30L is capable of covering the entire charge generation region 11 regardless of the area or the shape of the charge generation region 11.

In plan view of the photoelectric conversion device 301, the center of the charge generation region 11 and the center of optical axis of the phase adjustment lens 30L are preferred to coincide with each other.

Although the photoelectric conversion device 301 of the third embodiment can be used alone, a plurality of photoelectric conversion devices 301 may be arranged in a two-dimensional matrix to form an imaging device.

For example, as shown in the block diagram of FIG. 10, an imaging device 40 may have a light receiving region 41 in which a plurality of photoelectric conversion devices 301 are two-dimensionally arranged.

The imaging device 40 may be configured such that the number of the photoelectric conversion devices 301 and the arrangement of the photoelectric conversion devices 301 disposed in the light receiving region 41 are appropriately set. The shape of each phase adjustment lens 30L of the photoelectric conversion device 301 may also be set as appropriate.

For example, as shown in FIG. 16, the photoelectric conversion device 301 may have a diameter d of the phase adjustment lens 30L larger than the side length of the substrate 10, in plan view. In this case, the phase adjustment lens 30L is formed by removing a portion of the peripheral edge of the lens in accordance with the shape of the substrate 10, that is, a portion of the phase adjustment lens 30L protruding from the substrate 10 in plan view is removed. As a result, a plurality of photoelectric conversion devices 301 can be two-dimensionally arranged without having any gap between the adjacent phase adjustment lenses 30L interfering with each other. Further, a plurality of photoelectric conversion devices in a two-dimensional array may be formed on a single semi conductor wafer.

For example, as shown in FIG. 11, an imaging device 40 having a plurality of photoelectric conversion devices 301 used as the image sensor 121 may be applied to an imaging system. As the image sensor 121, a single photoelectric conversion device 301 or an imaging device 40 having a plurality of photoelectric conversion devices 301 may be applied.

The phase adjustment lens 30L of the image sensor 121 is designed based on the wavelength band of the emitted light L1 so as to produce an imaging system having less variation in accuracy of distance measurement.

The embodiments and modifications of the present invention have so far been described in detail with reference to the drawings. However, specific configurations are not limited to these embodiments. The present invention should encompass modifications, combinations, or the like of the embodiments, in the range not departing from the spirit of the present invention.

For example, the structure of the phase adjustment layer 230 described in the second embodiment may be applied to the phase adjustment lens 30L according to the third embodiment. In this case, the structure having a fine concavo-convex shape on the surface (lens surface) of the phase adjustment lens 30L is obtained.

For example, in the above-described embodiments and modifications, an example of a so-called front surface irradiation type photoelectric conversion device has been described, but the present invention is also applicable to a so-called back-surface irradiation type photoelectric conversion device.

The present application addresses the following. A photoelectric conversion device having a configuration described in the background has a reflectance to light incident thereon which varies in a wavelength region due to the multilayer film interference effect.

The amplitude and phase of the variation in reflectance vary in a complex manner depending on the thickness and refractive index of each layer constituting the multilayer film. The amplitude and phase of the reflectance also vary depending on the variation of the thickness and composition of the dielectric layer disposed inside the surface of the conversion device, the variation of the center wavelength of the light emitted from the light source, and the like.

The large amplitude of the reflectance variation causes a variation in sensitivity of the respective pixels constituting the photoelectric conversion device. This variation eventually affects the accuracy in distance measurement of the imaging system, and thus the amplitude of variation in reflectance is preferably as small as possible. However, as described above, since there are many factors that affect the amplitude and phase of reflectance variation, the control thereof is not easy.

In view of the above circumstances, the present invention has an aspect to provide a photoelectric conversion device having a reflectance to light incident thereon in which the variation is reduced.

Another aspect of the present invention is to provide an imaging device or an imaging system in which variation in accuracy of distance measurement in each of a plurality of pixels is small.

A photoelectric conversion device according to an aspect of the present invention is a photoelectric conversion device that receives reflected light that arises from reflection of emitted light that is light emitted from a light source on an object. The emitted light has a predetermined wavelength band. The photoelectric conversion device includes: a substrate which includes a charge generation region; a dielectric layer which is disposed on the substrate; and a phase adjustment layer which has an upper surface and a lower surface. The phase adjustment layer is disposed on the dielectric layer. In a cross-sectional view of the photoelectric conversion device, if a plane which extends parallel to the substrate in contact with the upper surface of the phase adjustment layer is defined as a first plane, and the lower surface of the phase adjustment layer is defined as a second plane, the phase adjustment layer is configured such that an optical path through which the reflected light which has entered the first plane perpendicularly to the photoelectric conversion device travels from the first plane to the second plane has a length which is different depending on a position where the reflected light is incident on the first plane.

In a photoelectric conversion device according to an aspect of the present invention, the maximum value of the difference in the length of the optical path of the reflected light transmitted through the phase adjustment layer may be ¼ or more of the average wavelength of the emitted light.

In a photoelectric conversion device according to an aspect of the present invention, the phase adjustment layer may be implemented by a phase adjustment lens having an aspect ratio h/d of 0.35 or more and 1.2 or less. The aspect ratio is a ratio of a bottom diameter d to a height h.

In a photoelectric conversion device according to an aspect of the present invention, the phase adjustment lens may cover 75% or more of the substrate in plan view of the photoelectric conversion device.

In a photoelectric conversion device according to an aspect of the present invention, the phase adjustment layer may have a fine concavo-convex shape.

In a photoelectric conversion device according to an aspect of the present invention, the phase adjustment layer may include a plurality of scattering particles.

An imaging device according to an aspect of the present invention includes a plurality of photoelectric conversion devices each of which has a structure identical to the photoelectric conversion device according to the above-described aspect. The photoelectric conversion devices are two-dimensionally arranged.

An imaging device according to an aspect of the present invention includes a plurality of photoelectric conversion devices each of which has a structure identical to the photoelectric conversion device according to the above-described aspect. The photoelectric conversion devices are two-dimensionally arranged. The phase adjustment lens of the respective photoelectric conversion devices has a diameter exceeding a length of a side of the substrate in plan view of the respective photoelectric conversion devices. The phase adjustment lens has a shape in which a portion of the phase adjustment lens protruding from the substrate is removed.

An imaging system according to an aspect of the present invention includes a light source which emits emitted light and the imaging device according to the aspect described above. The emitted light is light emitted from the light source and has a predetermined wavelength band.

An imaging system according to an aspect of the present invention includes a light source which emits emitted light and the photoelectric conversion device according to the aspect described above. The emitted light is light emitted from the light source and has a predetermined wavelength band.

The photoelectric conversion device according to an aspect of the present invention has a reduced variation in reflectance to incident light.

The imaging device and the imaging system according to an aspect of the present invention has little variation in accuracy of distance measurement between pixels.

REFERENCE SIGNS LIST 1, 201, 301 photoelectric conversion device
10 Substrate
11 Charge generation region
20 Dielectric layer
30, 230, 230A, 230B, 230C, 230D, 230E, 330, 330A, 330B Phase adjustment layer
30L Phase adjustment lens (phase adjustment layer)
30T Upper surface
30B Lower surface
32 Scattering particles
40 Imaging device
100 Imaging system
101 Light source
L1 Emitted light
RL, L2 Reflected light
PL1 First surface
PL2 Second surface Obviously, numerous modifications and variations of the present invention are possible in light of the above teachings. It is therefore to be understood that within the scope of the appended claims, the invention may be practiced otherwise than as specifically described herein.

What is claimed is:

1. A photoelectric conversion device, comprising:
a substrate including a charge generation region;
a dielectric layer formed on the substrate; and
a phase adjustment layer formed on the dielectric layer and comprising a plurality of scattering particles such that the plurality of scattering particles is forming a fine concavo-convex surface having a plurality of concave portions and a plurality of convex portions and that the fine concavo-convex surface is configured to receive reflected light from reflection of emitted light on an object and vary an optical path length to the charge generation region of the substrate depending on a position of the reflected light incident on the fine concavo-convex surface of the phase adjustment layer.

2. The photoelectric conversion device according to claim 1, wherein the fine concavo-convex surface of the phase adjustment layer is formed such that a maximum difference in the optical path length of the reflected light transmitted through the phase adjustment layer is ¼ or more of an average wavelength of the emitted light.

3. The photoelectric conversion device according to claim 1, wherein the phase adjustment layer comprises a transparent base resin and the scattering particles dispersed in the transparent base resin.

4. The photoelectric conversion device according to claim 2, wherein the phase adjustment layer comprises a transparent base resin and the scattering particles dispersed in the transparent base resin.

5. The photoelectric conversion device according to claim 1, wherein the plurality of scattering particles in the phase adjustment layer includes a plurality of transparent scattering particles.

6. The photoelectric conversion device according to claim 1, wherein the plurality of scattering particles in the phase adjustment layer includes a plurality of opaque scattering particles.

7. The photoelectric conversion device according to claim 1, wherein the dielectric layer includes a low refractive index layer formed on the substrate and a high refractive index layer formed on the low refractive index layer.

8. The photoelectric conversion device according to claim 2, wherein the dielectric layer includes a low refractive index layer formed on the substrate and a high refractive index layer formed on the low refractive index layer.

9. The photoelectric conversion device according to claim 1, wherein the phase adjustment layer comprises the plurality of scattering particles comprising a plurality of silica particles.

10. The photoelectric conversion device according to claim 1, wherein the phase adjustment layer comprises the plurality of scattering particles comprising a plurality of silica particles.

11. The photoelectric conversion device according to claim 1, wherein the scattering particles in the phase adjustment layer have particle sizes in a range of 10 nm to 3 µm.

12. An imaging device, comprising:
a plurality of photoelectric conversion devices each comprising the photoelectric conversion device of claim 1 such that the photoelectric conversion devices are two-dimensionally positioned.

13. An imaging system, comprising:
the imaging device of claim 12; and
a light source which emits the emitted light.

14. An imaging system, comprising:
the photoelectric conversion device of claim 1; and
a light source which emits the emitted light.

15. An imaging device, comprising:
a plurality of photoelectric conversion devices each is comprising the photoelectric conversion device of claim 3 such that the photoelectric conversion devices are two-dimensionally positioned.

16. An imaging system, comprising:
the imaging device of claim 15; and
a light source which emits the emitted light.

17. The photoelectric conversion device according to claim 3, wherein the dielectric layer includes a low refractive index layer formed on the substrate and a high refractive index layer formed on the low refractive index layer.

18. The photoelectric conversion device according to claim 4, wherein the dielectric layer includes a low refractive index layer formed on the substrate and a high refractive index layer formed on the low refractive index layer.

19. The photoelectric conversion device according to claim 5, wherein the dielectric layer includes a low refractive index layer formed on the substrate and a high refractive index layer formed on the low refractive index layer.

20. The photoelectric conversion device according to claim 6, wherein the dielectric layer includes a low refractive index layer formed on the substrate and a high refractive index layer formed on the low refractive index layer.

* * * * *